United States Patent [19]

Birrell

[11] Patent Number: 5,808,851
[45] Date of Patent: Sep. 15, 1998

[54] CONTROLLED SWITCHING

[75] Inventor: Peter C. Birrell, Darlinghurst, Australia

[73] Assignee: H.P.M. Industries PTY Limited, Australia

[21] Appl. No.: 728,446

[22] Filed: Oct. 10, 1996

[51] Int. Cl.[6] .................................................. H01H 47/22
[52] U.S. Cl. .............................................. 361/187; 361/2
[58] Field of Search ..................................... 361/187, 2–7

[56] References Cited

U.S. PATENT DOCUMENTS

| 4,864,157 | 9/1989 | Dickey | 307/135 |
|---|---|---|---|
| 4,897,755 | 1/1990 | Polster et al. | 361/2 |
| 5,064,998 | 11/1991 | Holling | 219/519 |
| 5,138,514 | 8/1992 | Fowler et al. | 361/2 |
| 5,245,256 | 9/1993 | Cassat et al. | 318/254 |
| 5,361,184 | 11/1994 | El-Sharkawi et al. | 361/93 |

Primary Examiner—Fritz Fleming
Attorney, Agent, or Firm—Ladas & Parry

[57] ABSTRACT

A method of and apparatus for controlling the opening and/or closing of contacts of an electro-mechanical switching device in an alternating current circuit. Detection is made for the existence of a voltage having a level which is indicative of a back emf in a load circuit immediately following opening of the contacts, and if such a voltage level is detected an incremental adjustment is made in the phase angle at which successive actuations of the contacts are effected. This procedure is repeated under the control of a microprocessor until such time as the voltage which is indicative of back emf reduces to zero, this providing an indication that contact opening is occurring at a time corresponding to zero current crossing in the alternating current waveform.

14 Claims, 2 Drawing Sheets

CONTROLLED SWITCHING

FIELD OF THE INVENTION

This invention relates to a method of and apparatus for controlling switching of electrical switching devices. The invention has particular application to controlling the switching of electromechanical switching devices such as relays and contactors and to the switching of reactive circuits, and the invention will hereinafter be described in such context. However, it will be understood that the invention may have broader application, for example to the control of other switching devices, such as solid state switching devices, and to the switching of non-reactive loads.

BACKGROUND OF THE INVENTION

Most electrical loads are predominantly inductively reactive, due typically to the presence in load circuits of induction motors, transformers and fluorescent lamp ballasts. Such circuits exhibit two interrelated characteristics, lagging current and back emf, the former of which gives rise to arc erosion of the contacts of electro-mechanical switching devices. This problem is significant when contact opening occurs at an inappropriate time in a given cycle or, expressed in an alternative way, if contact opening occurs at a time when the instantaneous value of current is relatively high. The problem is exacerbated in situations where highly repetitive switching is required. Also, with miniaturisation of switching devices and consequential reduction in the volume of metal present in contacts, arc erosion leads to more rapid deterioration than might occur in more robust devices.

The inductive reactance in a load frequently is countered and the load circuit power factor is improved by employing capacitors which have no function other than to create a capacitive reactance which balances at least in part the inductive reactance of the circuit. However, even if the load power factor is corrected to unity, so that the circuit is effectively wholly resistive under steady state conditions, complex transient conditions may exist at switch-on and/or switch-off. For example, a rapid rise of initially leading current may give rise to excessive arcing if contact bounce occurs with closing of contactor or relay contacts in a circuit that incorporates capacitors, even if the inductive reactance of the circuit is greater than the capacitive reactance.

The present invention recognises that contact damage will be minimised if switching is effected when alternating current is instantaneously at or near zero (i.e., during zero crossover) but, in order to avoid the relatively high cost and/or power loss that would be incurred in detecting for zero current crossing as such, it is proposed that the timing of switch operation (i.e., the timing of contact opening and/or closing in the case of an electro-mechanical switching device) be adjusted progressively to occur at or near the point of zero current crossing. Such adjustment is made responsive to the detection of a voltage that is indicative of the presence of back emf in the circuit.

SUMMARY OF THE INVENTION

The present invention may be defined broadly as providing a method of controlling a switching device which is connectable between a load and an alternating current supply. The method comprises the steps of:

(a) detecting for the existence of a voltage across the load following actuation of the switching device to a non-conducting state, and (b) if a voltage having a predetermined level is detected, incrementally adjusting the phase angle at which subsequent actuation of the switching device is effected in succeeding periods of the supply voltage.

The invention may also be defined in terms of an apparatus which is arranged to control a switching device which is connectable between a load and an alternating current supply. The apparatus comprises means for effecting actuation of the switching device between conducting and non-conducting conditions, means for detecting the existence of a predetermined voltage level across the load following actuation of the switching device to a non-conducting state, and means for incrementally adjusting the phase angle at which subsequent actuation of the switching device is effected in succeeding periods of the voltage supply.

If a voltage is detected to be present across the load following actuation of the switching device to a non-conductive condition and the voltage is at a level greater than that attributable to noise, the voltage will be a measure of a back emf generated in the load and, hence, will indicate the existence of an inductively reactive load and current flow through the load. Then, by adjusting the phase angle at which subsequent actuations of the switching device are effected in subsequent periods of the voltage supply until a point is reached at which no voltage is detected, a point of zero current crossing will be reached. The number of switching operations required to reach the desired operating condition would normally be very small relative to the total number of switching operations to be performed by the device.

PREFERRED FEATURES OF THE INVENTION

The method and apparatus as above defined have application to any form of switching device, including solid state switching devices which, whilst not subject to arcing problems, might desirably be controlled in certain applications to effect switching at a point of zero current crossing. However, the invention does have particular application to the control of electro-mechanical switching devices and, hence, to the protection of contacts against excessive arcing when the devices are actuated to open and/or closed conditions.

The invention in its more basic form may be employed primarily in the context of switching inductively reactive loads and, in this application of the invention, it may be arranged solely for controlling the opening of an electromagnetic switching device at or near a point of zero current crossing. To achieve this objective, control will be exercised progressively to retard (or delay) the timing of opening the contacts during succeeding periods of the applied voltage until a voltage indicative of back emf is no longer detected following successive openings of the contacts. However, the invention may take other forms, in which it is employed for controlling the timing of closing of switch contacts and, in the absence of any voltage that is indicative of back emf, for controlling opening and/or closing, but more particularly closing, of contacts in a circuit that has capacitive reactance.

In a preferred form of the invention as applied to electro-mechanical switching devices, detection is made for the presence of back emf or, more accurately, for the presence of a voltage which is indicative of the presence of back emf, within a predetermined period, typically one cycle following opening of the contacts of the switching device. However, it is most preferred that detection for the presence of back emf may be made within 10 mS of the opening of the contacts.

If a voltage which is indicative of the presence of back emf is detected within the predetermined period, the timing of the next succeeding opening of the contacts preferably is retarded (or delayed) for a period of time which is less than that of one half-cycle of the applied voltage waveform. The retardation period is most preferably equal to approximately 1 mS. Similarly, if back emf is not detected to be present within the predetermined period, timing of opening of the contacts is preferably advanced for a period of time that is less than one half-cycle of the applied voltage waveform and, most preferably, the advancement is effected for a period equal to approximately 1 mS.

In order to guard against the possibility that spurious signals may be detected to give a false indication of the existence of back emf, advancement or retardation, as the case may be preferably is delayed until at least two and preferably three detections are made of a voltage at an appropriate level following successive openings of the contacts.

The invention will be more fully understood from the following description of a preferred embodiment of an apparatus for use in controlling switching of an electromechanical relay. The description is provided with reference to the accompanying drawings.

DETAILED DESCRIPTION OF THE INVENTION

Figure 1:
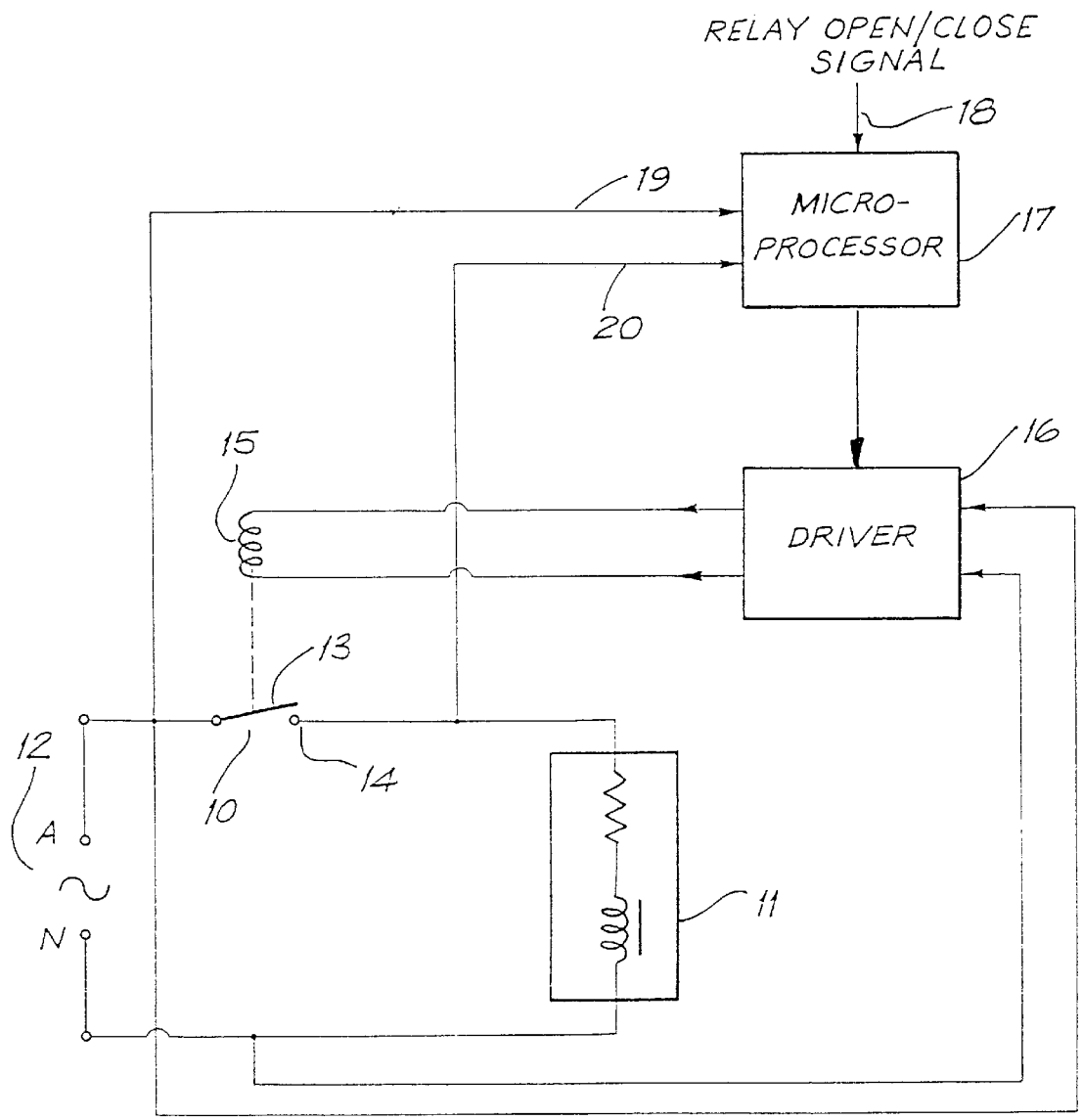
FIG. 1 shows a schematic representation of an electrical circuit having an inductively reactive load and a device for controlling actuation of a relay in circuit with the load.

As illustrated in FIG. 1, a relay 10 is located in series with an inductively reactive load 11, the load being connected across a single phase, alternating current supply 12. The relay 10 is shown for convenience as having a normally-open moving contact 13 which is opened and closed against fixed contact 14 by a solenoid coil 15, although a bistable relay might alternatively be employed. The relay coil 15 is energised from the supply 12 by way of a driver stage 16.

The driver stage 16 is controlled to effect energisation and de-energisation of the coil 15 and, hence, closing and opening of the moving contact 13 at a predetermined phase angle in the periodic waveform of the supply voltage. To this end, the driver stage 16 is coupled electrically to a microprocessor 17 to which three inputs are applied. The first input 18 is applied, when required, as a relay open or close command signal. The second input 19 comprises a supply voltage signal at mains frequency and it is employed to synchronise operation of the microprocessor. The third input 20 is applied as a measure of the back emf voltage that is generated in the load 11 following opening of the relay contacts 13 and 14. This would normally take the form of a signal that has a steeply rising leading edge, exhibiting a mathematical step function, and would not have a sinusoidal waveform.

As indicated previously, it is desired that the relay contacts 13 and 14 be opened and/or closed (but referred to hereinafter simply as "opened") at a time when the alternating load current has an instantaneous value at or near zero, and it has been determined that a convenient way of achieving this is to detect for the existence of back emf in the circuit and to adjust progressively the timing of opening of the relay contacts until the back emf reduces to a level at or near zero volts. To achieve this, having detected the existence of back emf within a predetermined time period of 10 mS following opening of the relay contacts, the timing of next opening of the relay contacts is retarded by a predetermined amount. This is effected by adjusting (i.e., retarding) the phase angle at which contact opening is effected in the applied voltage waveform and it is for this reason that the operation of the microprocessor 17 is synchronised with the frequency of the supply voltage.

Figure 2:
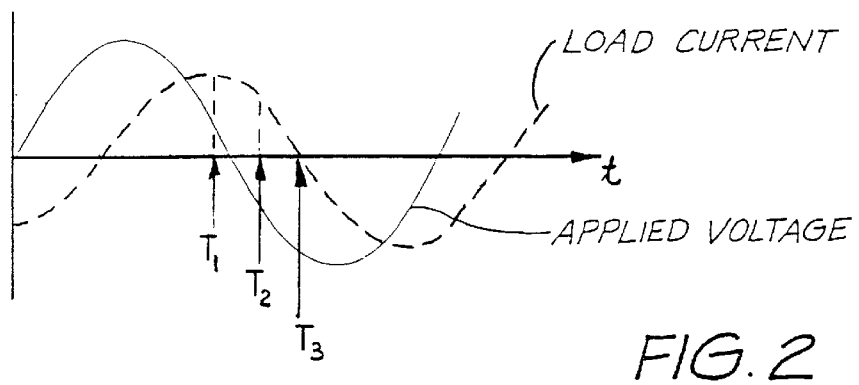
FIG. 2 shows a waveform of applied voltage and load current at relay contact opening times.

In a particularly preferred form of the invention, adjustment of the phase angle at which contact opening is effected is made in one of two directions, depending upon whether the back emf is or is not detected within the 10 mS predetermined period following opening of the contacts. If a voltage signal is detected which indicates the presence of back emf, the timing of the next opening of the contacts is delayed by 1 mS relative to the timing on the supply voltage waveform of the previous opening of the contacts. This relative timing is synchronised and hence controlled with respect to the applied voltage waveform and, thus, the succeeding opening is effectively made at a retarded phase angle relative to the preceding opening. This is indicated in FIG. 2 of the drawings, which shows waveforms of applied voltage and lagging current, wherein $T_1$ indicates the point on the voltage/current waveform at which the coil 15 is energised to first open the contacts and $T_2$ indicates in relative terms the (retarded) point at which the coil is energised to next open the contacts when the relay is next actuated. Of course, the actual clock time of opening of the contacts is arbitrary and it is only with respect to the voltage waveform that the points $T_1$ and $T_2$ are shifted progressively in 1 mS (i.e. 18-degree) increments.

From the diagrammatic representation of FIG. 2 it can be seen that progressive retardation of the opening timing relative to the applied voltage will lead eventually to a condition where opening of the contacts is effected at the zero current crossover point $T_3$, and at this point of contact opening arcing will be minimised between the fixed and moving contacts 13 and 14.

Figure 3:
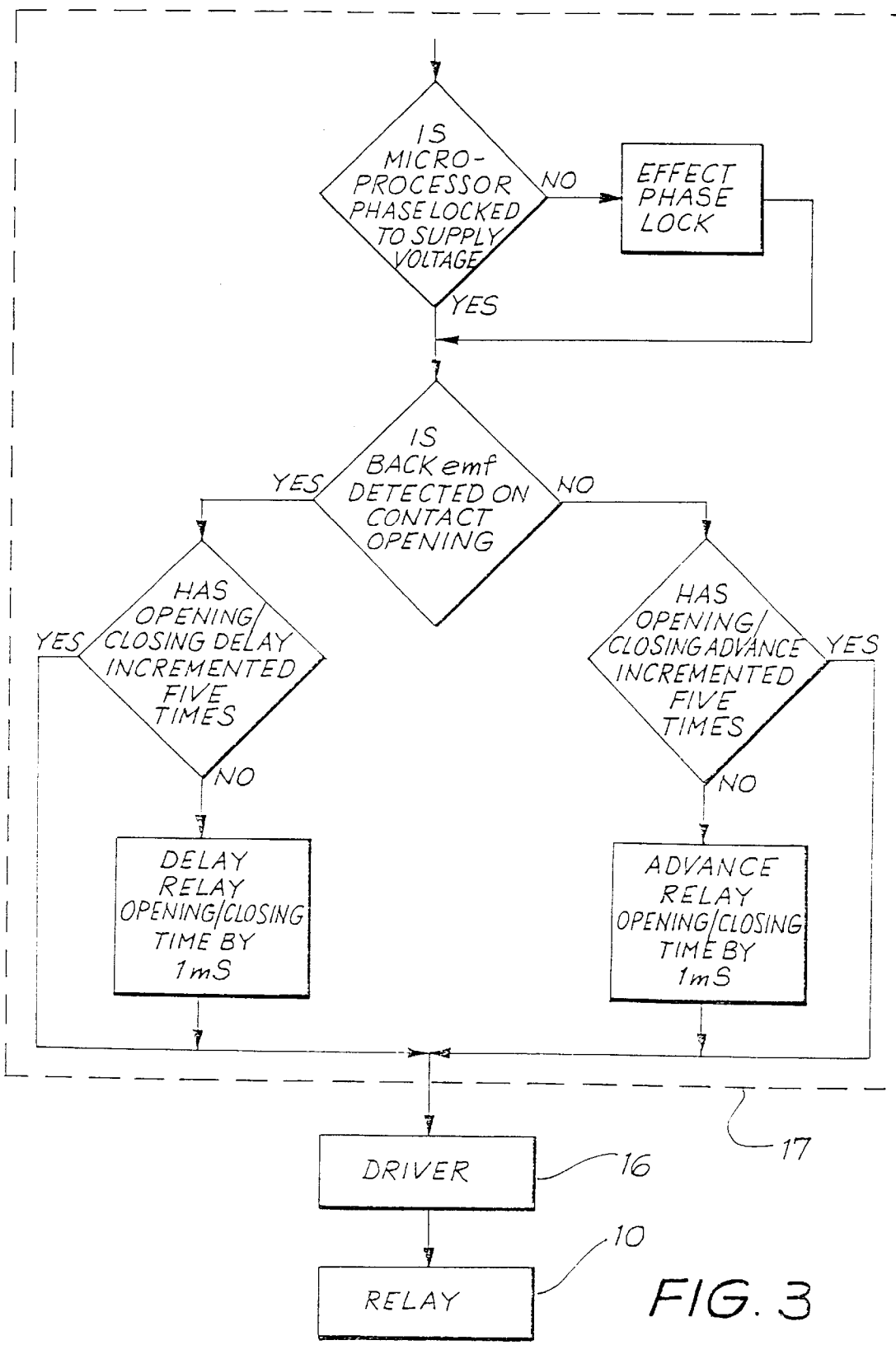
FIG. 3 shows in block diagrammatic form control functions that are relevant to a microprocessor shown in FIG. 1.

The above described operations are program controlled in the microprocessor 17 and the various process control functions are indicated diagrammatically in the flow diagram shown in FIG. 3.

As indicated in FIG. 3, when a relay "open" signal 18 is applied to the microprocessor 17, a test is made as to whether the processor is phase locked to the supply voltage 19 and, hence, to the supply voltage frequency. The frequency is assumed for the purpose of this specification to be 50 Hz, and in the case of a 60 Hz supply appropriate adjustments will need be made in some of the stated timing periods. If the test is determined in the negative, phase locking is effected and further processing proceeds.

If the synchronisation test is answered in the affirmative, a test is made as to whether a back emf is detected following contact opening. Thus, a test is made as to whether a voltage input 20 has a rise time greater than that of the supply voltage and whether the voltage input 20 has an amplitude greater than that which would be attributable to circuit noise. This test is made within 10 mS following opening (i.e., "current" opening) of the contacts and would normally be completed well within 1 mS following the contact opening.

If a voltage indicative of the existence of back emf is tested in the affirmative, the processor is programmed to effect a 1 mS delay in the timing of the next succeeding opening of the contacts relative to the time on the voltage waveform at which the "current" opening is effected. However, the creation of such delay is subject to a preceding test as to whether the closing delay has already been incremented five times, to establish a total delay of 5 mS or, in other words, a total phase angle retardation of 90°.

If the presence of a voltage 20 indicative of back emf is tested in the negative within a period of 10 mS following a "current" opening of the contacts (this indicating the possibility of a capacitive load), the processor is programmed to effect a 1 mS advance in the timing of the next succeeding opening of the contacts relative to the time on the voltage waveform at which the current opening is effected. However, as in the case of the delay implementation, the advancement of opening also is subject to a preceding test that the closing time advancement has not already incremented five times since a change occurred in the test for the existence of a voltage indicative of back emf in the circuit.

The various process steps shown in the flow diagram of FIG. 3 may be implemented in any microprocessor having elements that are arranged to perform the process steps under program control. Such a microprocessor is well known in the art and program control may be implemented in any manner to give effect to the algorithm which underlies the flow diagram shown in FIG. 3.

I claim:

1. A method of controlling a switching device which is connectable between a load and an alternating current supply, the method comprising the steps of:
    a) detecting for the existence of a voltage across the load following actuation of the switching device to a non-conducting state,
    b) determining if the detected voltage across the load is one which is indicative of back emf generated in the load, and
    c) if the detected voltage is determined to be one which is indicative of back emf generated in the load, incrementally adjusting the phase angle in the supply voltage waveform at which subsequent actuation of the switching device is effected in succeeding periods of the supply voltage whereby timing of the actuation of the switching device in the succeeding periods is delayed incrementally by a period of time which is less than that occupied by one half-cycle of the alternating current supply.

2. The method as claimed in claim 1 wherein the phase angle is incrementally adjusted to retard the timing of actuation of the switching device in succeeding actuations of the device.

3. The method as claimed in claim 2 wherein the phase angle is adjusted over succeeding actuations of the device to a maximum extent not exceeding 90°.

4. The method as claimed in claim 1 wherein the detection for the existence of a voltage across the load is made within a period of time less than that occupied by one cycle of the alternating current waveform following actuation of the switching device to a non-conducting state.

5. The method as claimed in claim 1 wherein the detection for the existence of a voltage across the load is made within 10 mS following actuation of the switching device to the non-conducting state.

6. The method as claimed in claim 1 wherein the phase angle is incrementally adjusted in a manner such that the timing of actuation of the switching device in succeeding periods is delayed incrementally by approximately 1 mS.

7. The method as claimed in claim 1 wherein, if a voltage across the load is not detected following actuation of the switching device to a non-conducting state, the phase angle at which subsequent actuations of the switching device is effected is incrementally adjusted to advance the timing of actuation of the switching device in succeeding actuations of the device.

8. The method as claimed in claim 7 wherein the phase angle which is incrementally adjusted to advance the timing of actuation of the switching device is adjusted over succeeding actuations of the switching device to a maximum extent not exceeding 90°.

9. The method as claimed in claim 1 wherein the incremental adjustment of the phase angle is effected only when the switching device is actuated to a non-conducting state.

10. The method as claimed in claim 1 when applied to the control of a switching device in the form of an electro-mechanical switching device.

11. An apparatus which is arranged to control a switching device which is connectable between a load and an alternating current supply, the apparatus comprising means for effecting actuation of the switching device between conducting and non-conducting conditions, means for detecting the existence of a voltage across the load following actuation of the switching device to a non-conducting state, means for determining if the detected voltage across the load in one which is indicative of back emf generated in the load, and means for incrementally adjusting the phase angle in the supply voltage waveform at which subsequent actuation of the switching device is effected to succeeding periods of the voltage supply whereby timing of the actuation of the switching device in the succeeding periods is delayed incrementally by a period of time which is less than that occupied by one-half cycle of the alternating current supply.

12. The apparatus as claimed in claim 11 wherein the means for detecting the existence of the predetermined voltage level and for incrementally adjusting the phase angle at which subsequent actuation of the switching device is effected are embodied in a microprocessor.

13. The apparatus as claimed in claim 12 wherein the means for effecting actuation of the switching device includes a driver stage which is operated under the control of the microprocessor.

14. The apparatus as claimed in claim 11 when integrated with the switching device, and wherein the switching device comprises an electro-mechanical switching device.

* * * * *